(12) United States Patent
Schunk

(10) Patent No.: US 8,265,487 B2
(45) Date of Patent: Sep. 11, 2012

(54) HALF-DUPLEX, SINGLE-FIBER (S-F) OPTICAL TRANSCEIVER MODULE AND METHOD

(75) Inventor: Nikolaus W. Schunk, Maxhuette-Haidhof (DE)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 545 days.

(21) Appl. No.: 12/511,262

(22) Filed: Jul. 29, 2009

(65) Prior Publication Data

US 2011/0026919 A1    Feb. 3, 2011

(51) Int. Cl.
*H04B 10/00* (2006.01)
(52) U.S. Cl. .................. 398/139; 398/138; 398/135
(58) Field of Classification Search .......... 398/135–139; 385/88–94
See application file for complete search history.

(56) References Cited

U.S. PATENT DOCUMENTS

| | | | | |
|---|---|---|---|---|
| 4,980,568 A | * | 12/1990 | Merrick et al. ................ 250/551 |
| RE35,069 E | * | 10/1995 | Hallenbeck et al. ........... 250/216 |
| 5,808,325 A | * | 9/1998 | Webb ................................ 257/99 |
| 5,905,750 A | * | 5/1999 | Lebby et al. ................. 372/50.21 |
| 5,981,945 A | * | 11/1999 | Spaeth et al. ................... 250/239 |
| 5,993,075 A | * | 11/1999 | Huang et al. ..................... 385/92 |
| 6,051,848 A | * | 4/2000 | Webb ................................ 257/99 |
| 6,109,797 A | * | 8/2000 | Nagura et al. .................... 385/88 |
| 6,301,035 B1 | * | 10/2001 | Schairer ......................... 398/128 |
| 6,309,566 B1 | * | 10/2001 | Muller et al. ................. 264/1.25 |
| 6,453,091 B2 | * | 9/2002 | Kawai ............................... 385/33 |
| 6,550,982 B2 | * | 4/2003 | Auburger et al. ................ 385/88 |
| 6,567,435 B1 | * | 5/2003 | Scott et al. ............... 372/29.021 |
| 6,580,533 B1 | | 6/2003 | Hurt et al. |
| 6,603,148 B1 | * | 8/2003 | Sano et al. ....................... 257/98 |
| 6,603,584 B1 | * | 8/2003 | Jokerst et al. ................. 398/135 |
| 6,694,074 B2 | * | 2/2004 | Schunk ............................ 385/33 |
| 6,721,503 B1 | * | 4/2004 | Jokerst et al. ................... 398/41 |
| 6,845,118 B1 | * | 1/2005 | Scott ............................... 372/96 |
| 6,869,232 B2 | * | 3/2005 | Schunk et al. ................... 385/93 |
| 6,873,799 B2 | * | 3/2005 | Cohen et al. .................. 398/135 |
| 6,954,592 B2 | | 10/2005 | Tan et al. |
| 6,969,204 B2 | * | 11/2005 | Kilian ............................. 385/93 |
| 7,073,957 B2 | * | 7/2006 | Schunk et al. ................... 385/92 |
| 7,098,485 B2 | * | 8/2006 | Isokawa ......................... 257/98 |
| 7,101,089 B2 | * | 9/2006 | Sohmura et al. ................ 385/88 |
| 7,128,477 B2 | | 10/2006 | Tabata et al. |
| 7,158,700 B2 | * | 1/2007 | Duncan et al. .................. 385/31 |
| 7,160,039 B2 | * | 1/2007 | Hargis et al. .................... 385/93 |
| 7,217,043 B2 | * | 5/2007 | Schunk ............................ 385/94 |

(Continued)

OTHER PUBLICATIONS

Mark W. Beranek, Eric Y. Chan, Chiu-Choa Chen, et al., Passive Alignment Optical Subassemblies for Military/Aerospace Fiber-Optic Transmitter/Receiver Modules; IEEE Transactions on Advanced Packaging, Aug. 2000, pp. 461-469, vol. 23, No. 3, IEEE.

(Continued)

*Primary Examiner* — Agustin Bello

(57) ABSTRACT

A half-duplex, single-fiber (S-F) optical transceiver module is provided in which a light source, such as a laser diode or a light-emitting diode (LED), is mounted on an edge region of a photodiode to increase the amount of surface area of the photodiode that is available for absorbing light received in the optical transceiver module. The S-F optical transceiver module has a relatively simple optical coupling system for coupling light between an end face of an optical fiber and the photodiode and laser diode or LED with high optical coupling efficiency and reduced optical crosstalk.

18 Claims, 6 Drawing Sheets

U.S. PATENT DOCUMENTS

| | | | |
|---|---|---|---|
| 7,245,834 B2 * | 7/2007 | Vigier-Blanc et al. | 398/135 |
| 7,294,863 B2 * | 11/2007 | Lee et al. | 257/98 |
| 7,307,285 B2 * | 12/2007 | Noguchi | 257/82 |
| 7,309,174 B2 * | 12/2007 | Farr | 385/94 |
| 7,332,784 B2 * | 2/2008 | Mills et al. | 257/433 |
| 7,333,684 B2 * | 2/2008 | Shie et al. | 385/15 |
| 7,359,646 B2 * | 4/2008 | Kropp | 398/164 |
| 7,371,012 B2 * | 5/2008 | Schunk | 385/88 |
| 7,418,208 B2 * | 8/2008 | Weigert | 398/135 |
| 7,474,814 B2 * | 1/2009 | Nagura | 385/14 |
| 7,500,792 B2 * | 3/2009 | Supper | 385/90 |
| 7,654,753 B2 * | 2/2010 | Sheau Tung Wong et al. | 385/93 |
| 7,755,030 B2 * | 7/2010 | Minamio | 250/239 |
| 7,824,163 B2 * | 11/2010 | Feick | 425/135 |
| 7,824,937 B2 * | 11/2010 | Suehiro et al. | 438/26 |
| 7,872,686 B2 * | 1/2011 | Kale et al. | 348/374 |
| 7,907,845 B2 * | 3/2011 | Yasumoto et al. | 398/135 |
| 7,957,448 B2 * | 6/2011 | Willemin et al. | 372/50.21 |
| 8,044,474 B2 * | 10/2011 | Blumel | 257/432 |
| 2004/0012698 A1 * | 1/2004 | Suda et al. | 348/315 |
| 2005/0013554 A1 | 1/2005 | Killer et al. | |
| 2005/0213983 A1 * | 9/2005 | Shie et al. | 398/135 |
| 2005/0254758 A1 * | 11/2005 | Kropp | 385/89 |
| 2005/0278936 A1 * | 12/2005 | Schunk | 29/592.1 |
| 2011/0026919 A1 * | 2/2011 | Schunk | 398/41 |

OTHER PUBLICATIONS

Hideaki Fujita, Yorishige Ishii, Toshihisa Matsuo et al., Optical Transceiver for OP i.LINK S200/S400; Opto-Electronic Devices Division, Electronic Components Group, Sharp Corporation, Jul. 2008, VI Systems GmbH, 2002 pp. 25-27, Japan.

\* cited by examiner

HALF-DUPLEX, SINGLE-FIBER (S-F) OPTICAL TRANSCEIVER MODULE AND METHOD

TECHNICAL FIELD OF THE INVENTION

The invention relates to optical communications networks over which data is communicated in the form of optical signals over optical waveguides. More particularly, the invention relates to an optical transceiver module that uses space diversity multiplexing (SDM) to transmit and receive optical data signals over a single optical fiber.

BACKGROUND OF THE INVENTION

In optical communications networks, optical transceiver modules are used to transmit and receive optical signals over optical waveguides, which are typically optical fibers. An optical transceiver module includes a transmitter (Tx) portion and a receiver (Rx) portion. In the Tx portion, a light source is modulated based on an electrical data signal and generates corresponding optical data signals. An optical coupling system of the optical transceiver module optically couples the optical data signals into an end of an optical fiber. The light source is typically a laser diode, but is sometimes a light emitting diode (LED). In the Rx portion of the optical transceiver module, a photodetector, which is typically a photodiode, detects optical data signals transmitted over an optical fiber and converts the optical data signals into electrical data signal, which are then amplified and processed by electrical circuitry in the Rx portion to recover the data.

In typical small form factor (SFF) optical transceiver modules and small form factor pluggable (SFP) optical transceiver modules, a transmit optical fiber is connected to the Tx portion of the module and a receive optical fiber is connected to the Rx portion of the module. Optical data signals generated in the Tx portion are transmitted over the transmit fiber and optical data signals transmitted over the receive optical fiber are received in the Rx portion. In such modules, the Tx and the Rx portions typically include respective optical coupling systems for coupling optical signals between the laser diode and photodiode of the Tx portion and Rx portion, respectively, and the transmit optical fiber and the receive optical fiber, respectively.

In contrast to the typical known SFF and SFP optical transceiver modules, optical transceiver modules are also known that use a single fiber for bi-directional communications. In these single-fiber optical transceiver modules, a single optical fiber is used for transmitting optical data signals produced by a laser diode of the module and for receiving optical data signals transmitted over the fiber on a photodiode of the module. In most of these single-fiber optical transceiver modules, the laser diode IC and the photodiode IC are spatially separated in the modules. In these modules, various types of optical coupling systems are used to optically couple the transmitted and received optical data signals between the laser diode and the photodiode, respectively, and the end of the optical fiber. The spatial arrangement of the laser diode and the photodiode and the configuration of the optical coupling systems are typically designed to prevent optical crosstalk between the laser diode and the photodiode, while also providing adequate optical coupling efficiency for the transmitted and received light being coupled between the laser diode and the photodiode, respectively, and the end of the optical fiber.

Although spatially separating the laser diode and the photodiode from each other helps to reduce optical crosstalk, relatively complex optical coupling systems are typically needed to ensure that there is good optical coupling efficiency for the transmitted and received optical data signals. The use of relatively complex optical coupling systems increases the overall cost of the module, while spatially separating the laser diode and the photodiode increases the overall size of the module.

It is also known in single-fiber optical transceiver modules to co-locate, or stack, the laser diode and the photodiode together, or even to integrate them into the same IC package. However, such arrangements typically also require the use of relatively complex optical coupling systems to prevent optical crosstalk between the laser diode and the photodiode. In addition, in such arrangements, stacking of the photodiode and the laser diode or LED or integrating them together typically reduces the amount of effective area on the photodiode that is available for light absorption due to the fact that the laser diode or LED blocks a portion of the received light. Therefore, in such arrangements, the optical coupling efficiency for the received light may be less than adequate unless other precautions are taken to enhance the optical coupling efficiency. In addition, in such arrangements it is often necessary that a laser diode be used instead of an LED due to the fact that a laser diode produces a smaller optical far field than that produced by an LED. The smaller optical far field of the laser diode helps reduce optical crosstalk between the laser diodes on each end of the optical link.

A need exists for a single-fiber optical transceiver module in which the photodiode and the laser diode or LED can be co-located, that has high receive and transmit optical coupling efficiency, that is configured to reduce optical crosstalk, and that uses a relatively simple optical coupling system.

SUMMARY OF THE INVENTION

The invention is directed to a half-duplex, single-fiber (S-F) optical transceiver module for use in an optical fiber link. The S-F optical transceiver module comprises a leadframe, a photodiode, a light source, a transparent molded encapsulation, and an optical coupling system integrally formed in the transparent molded encapsulation. The leadframe has at least a first leadframe portion, a second leadframe portion, and a plurality of electrically conductive leads. The first leadframe portion has an upper surface and a lower surface. Likewise, the second leadframe portion has an upper surface and a lower surface. The photodiode has a cathode, an anode, an upper light-receiving surface, and a lower mounting surface. The photodiode is disposed on the upper surface of the first leadframe portion such that the lower mounting surface of the photodiode is adjacent the upper surface of the first leadframe portion. The light source has a cathode, an anode, an upper light-emitting surface, and a lower mounting surface. The light source is disposed on an edge region of the upper light-receiving surface of the photodiode such that the lower mounting surface of the light source is adjacent the upper light-receiving surface of the photodiode in the edge region of the upper light-receiving surface. The transparent molded encapsulation encapsulates the photodiode, the light source, and a portion of the leadframe that includes at least the first and second leadframe portions. The optical coupling system integrally formed in the transparent molded encapsulation includes at least a lens portion and an alignment portion. The alignment portion is configured to provide at least one surface that abuts a first end face of an optical fiber when the first end face of the optical fiber is attached to the optical coupling system. When the first end face of the optical fiber is attached to the optical coupling system, the lens portion is configured to optically couple light passing out of the first end face of the optical fiber onto the upper light-receiving surface of the photodiode and to optically couple light emitted from the upper light-emitting surface of the light source onto the end face of the optical fiber and into a core of the optical fiber.

The method comprises providing a half-duplex, S-F optical transceiver module having a leadframe, a photodiode, a light source, and a transparent molded encapsulation having an optical coupling system integrally formed therein. The leadframe has at least a first leadframe portion, a second leadframe portion, and a plurality of electrically conductive leads. The first and second leadframe portions each have an upper surface and a lower surface. The photodiode has a cathode, an anode, an upper light-receiving surface, and a lower mounting surface. The photodiode is disposed on the upper surface of the first leadframe portion such that the lower mounting surface of the photodiode is adjacent the upper surface of the first leadframe portion. The light source has a cathode, an anode, an upper light-emitting surface, and a lower mounting surface. The light source is disposed on an edge region of the upper light-receiving surface of the photodiode such that the lower mounting surface of the light source is adjacent the upper light-receiving surface of the photodiode in the edge region of the upper light-receiving surface. The transparent molded encapsulation encapsulates the photodiode, the light source, and a portion of the leadframe that includes at least the first and second leadframe portions. With a lens portion of the optical coupling system, light passing out of a first end face of an optical fiber is optically coupled onto the upper light-receiving surface of the photodiode and light emitted by the upper light-emitting surface of the light source is optically coupled onto the first end face of the optical fiber.

These and other features and advantages of the invention will become apparent from the following description, drawings and claims.

DETAILED DESCRIPTION OF AN ILLUSTRATIVE EMBODIMENT

In accordance with the invention, a half-duplex, single-fiber (S-F) optical transceiver module is provided in which a light source, such as a laser diode or an LED, is mounted on an edge region of a photodiode to increase the amount of surface area of the photodiode that is available for absorbing light received in the optical transceiver module. The S-F optical transceiver module has a relatively simple optical coupling system for coupling light between an end of an optical fiber and the photodiode and laser diode or LED with high optical coupling efficiency and reduced optical crosstalk.

Figure 1:
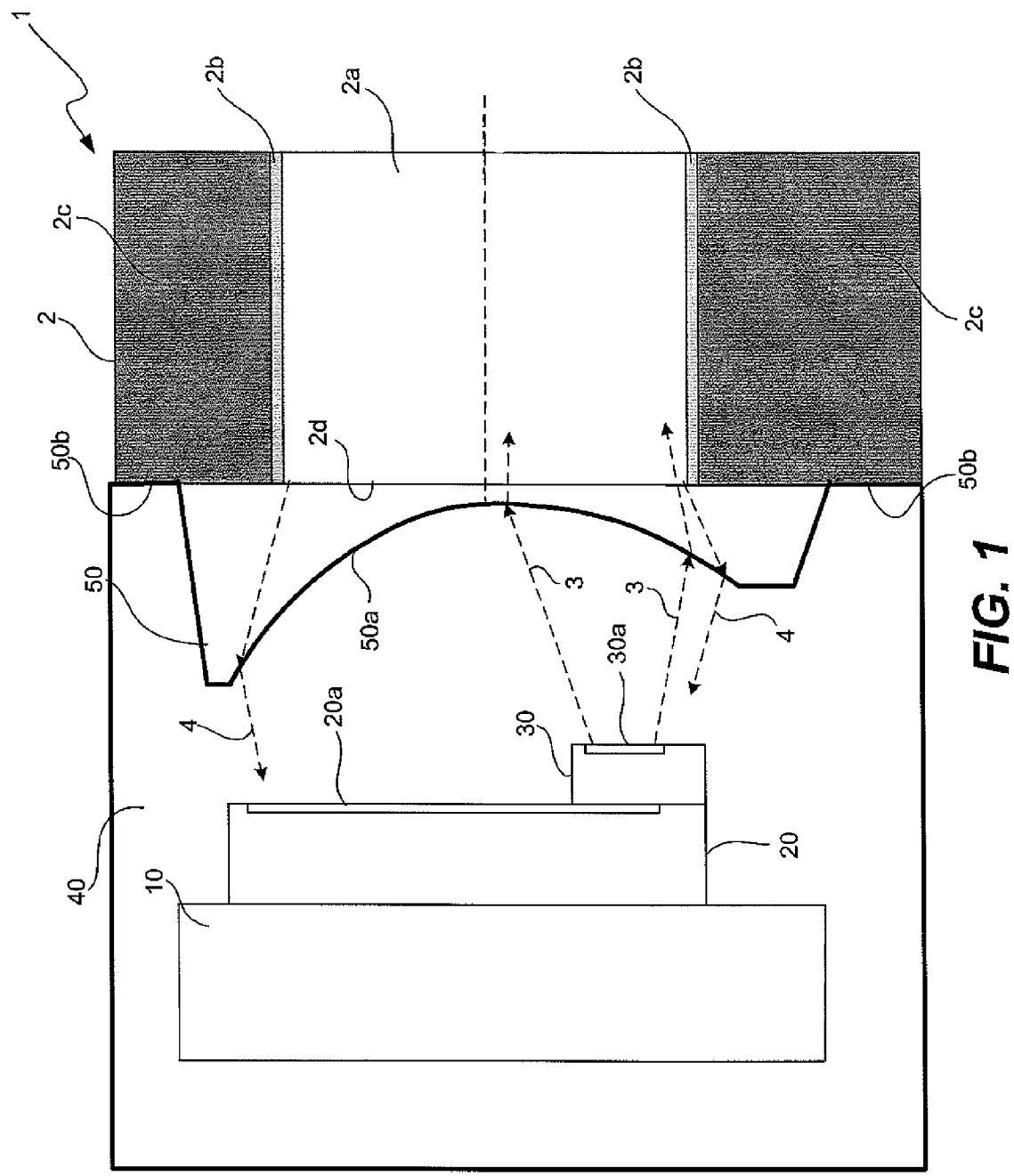
FIG. 1 illustrates a side plan view of a half-duplex, S-F optical transceiver module in accordance with an illustrative embodiment, which is shown connected to an end face of an optical fiber.

FIG. 1 illustrates a side plan view of a half-duplex, S-F optical transceiver module 1 in accordance with an illustrative embodiment, which is shown connected to an end face of an optical fiber 2. The S-F optical transceiver module 1 includes a leadframe 10, a photodiode 20 mounted on an upper surface of the leadframe 10, a light source 30 mounted on an edge of the photodiode 20, a transparent molded encapsulation 40, and a transparent optical coupling device 50 integrally formed in the transparent molded encapsulation 40. The light source 30 is either an LED or a laser diode, such as, for example, a vertical cavity surface emitting laser diode (VCSEL). The optical fiber 2 may be a glass or plastic optical fiber, such as, for example, a one-millimeter (mm) plastic optical fiber or multi-core glass optical fiber. The optical fiber 2 has a core 2a, a cladding layer 2b surrounding the core 2a, a jacket 2c surrounding the cladding layer 2b, and an end face 2d.

The transparent optical coupling system 50 is integrally formed in a portion of a transparent molded encapsulation 40, which, as described in more detail with reference to FIGS. 4 and 5, encapsulates the optical transceiver module 1 in a molded optical transceiver module package. For ease of illustration, only a portion of the molded package can be seen in the side plan view shown in FIG. 1. When the S-F optical transceiver module 1 is transmitting optical data signals, it is not receiving optical data signals, and vice versa. Thus, the S-F optical transceiver module 1 is a half-duplex optical transceiver module. The optical coupling system 50 includes a lens portion 50a and an alignment portion 50b. The lens portion 50a has a radius of curvature that is selected to couple light emitted by a light-emitting surface 30a of the light source 30 onto the end face 2d of the optical fiber 2 and to couple light passing out of the end face 2d of the optical fiber 2 onto a light-receiving surface 20a of the photodiode 20. The alignment portion 50b passively aligns the S-F optical transceiver module 1 with the end face 2d of the optical fiber 2 when the end face 2d is being attached to the module 1, as will be described below in more detail with reference to FIGS. 4 and 5.

The combination of the spatial positioning of the light source 30 on the edge of the photodiode 20 and the configuration of the optical coupling system 50 results in a spatial diversity multiplexing (SDM) of the light that is transmitted and received by the S-F optical transceiver module 1. The SDM configuration reduces optical crosstalk and increases optical coupling efficiency. Light produced by the light source 30 (represented by the arrows labeled with reference numeral 3) is received at a bottom portion of the lens portion 50a and directed by the lens portion 50a into the end face 2d of the optical fiber 2. Light passing out of the end face 2d (represented by the arrows labeled with reference numeral 4) is directed by the lens portion 50a onto the light receiving surface 20a of the photodiode 20. The radius of curvature of the lens portion 50a causes all but a very small portion of the received light that passes out of the end face 2d to be directed onto the light-receiving surface 20a of the photodiode 20. Thus, only a very small portion of the received light impinges on the light source 30. Consequently, the optical coupling efficiency for light being received in the S-F optical transceiver module 1 is very high. Similarly, the radius of curvature of the lens portion 50a causes most if not all of the light that is produced by the light source 30 to be directed onto the end face 2d of the optical fiber 2. Consequently, the optical coupling efficiency for light being transmitted by the S-F optical transceiver module 1 is also very high.

Figure 2:
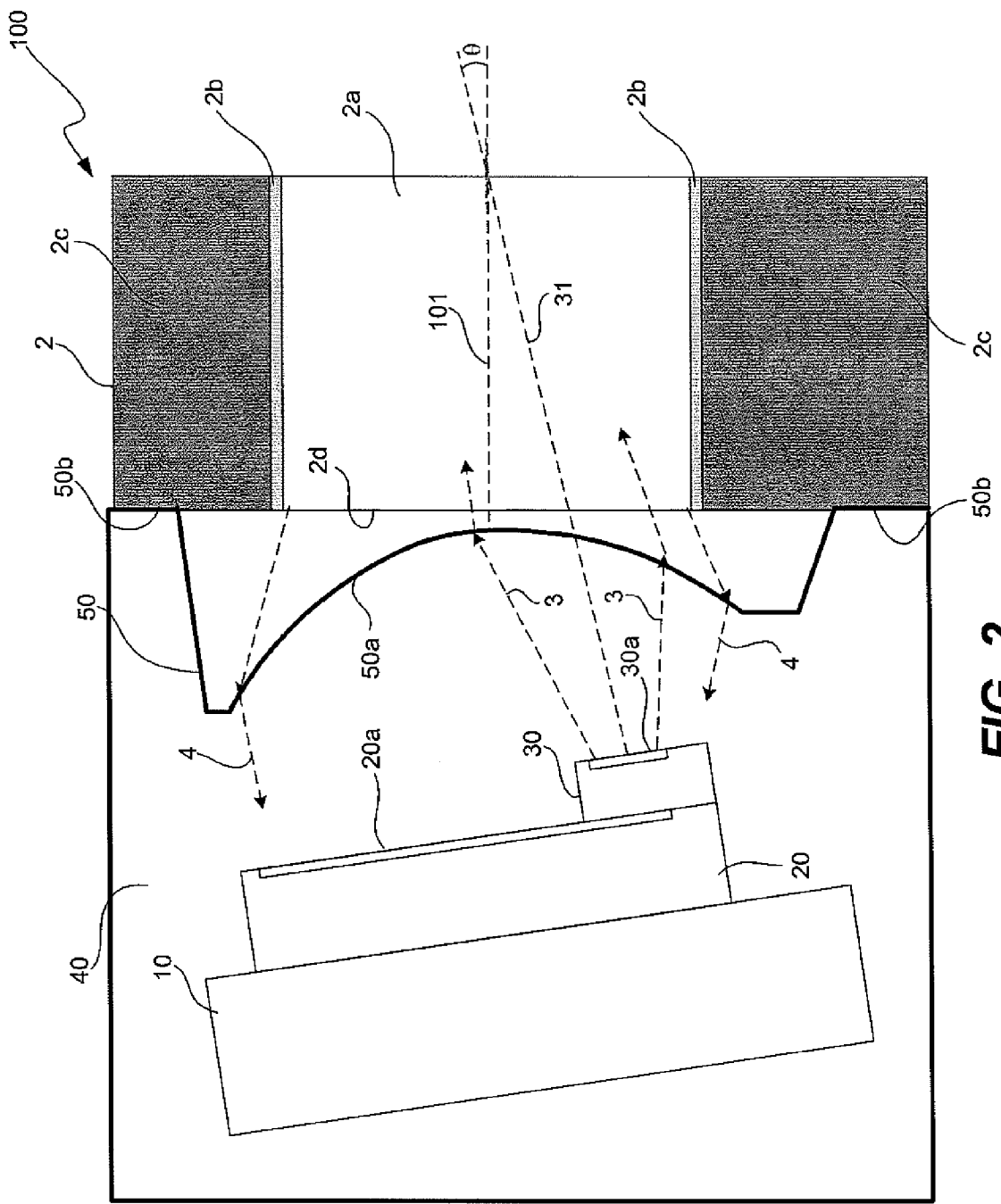
FIG. 2 illustrates a top plan view of the half-duplex, S-F optical transceiver module shown in FIG. 1 in accordance with another illustrative embodiment in which the portion of the leadframe on which the photodiode and the light source are mounted is tilted with respect to the optical axis of the optical fiber.

FIG. 2 illustrates a top plan view of the half-duplex, S-F optical transceiver module 100 in accordance with another illustrative embodiment in which the portion of the leadframe 10 on which the photodiode 20 and the light source 30 are mounted is tilted with respect to the optical axis of the optical fiber 2. The S-F optical transceiver module 100 shown in FIG. 2 is identical to the S-F optical transceiver module 1 shown in FIG. 1, except that, unlike the S-F optical transceiver module 1 shown in FIG. 1, the S-F optical transceiver module 100 shown in FIG. 2 is tilted with respect to the optical axis of the optical fiber 2. Therefore, like numerals in FIGS. 1 and 2 represent like elements or components of the modules 1 and 100.

The optical axis of the optical fiber 2 is represented by the horizontal dashed line labeled with reference numeral 101. The optical axis of the light source 30 is represented by a dashed line 31 that is normal to the light-emitting surface 30a of the light source 30. As indicated by the intersection of the dashed lines 31 and 101 in FIG. 2, the optical axis of the light source 30 is at an angle, $\theta$, to the optical axis 101 of the optical fiber 2. The angle $\theta$ represents the angular amount by which the leadframe 10 is tilted with respect to the optical axis 101 of the optical fiber 2. As in FIG. 1, the dashed lines with arrows 3 shown in FIG. 2 represent the light that is emitted from the light-emitting surface 30a of the light source 30. A comparison of the dashed lines 3 shown in FIGS. 1 and 2 shows that when the leadframe 10 is tilted in the manner depicted in FIG. 2, more of the light that is emitted by the light source 30 is coupled into the end face 2d of the optical fiber 2 than when the leadframe 10 is not tilted (i.e., when the plane of the leadframe 10 is perpendicular to the optical axis 101 of the optical fiber 2). The tilt angle $\theta$ ranges from about 5° to about 20°, and is typically about 5°. It should be noted, however, that the invention is not limited to any particular tilt angle or range of tilt angles.

Tilting the leadframe 10 in the manner depicted in FIG. 2 increases the optical coupling efficiency for the transmit power, i.e., for the light emitted by light source 30 and coupled by the optical coupling device 50 onto the end face 2d of the optical fiber 2. As will be described below in more detail, the leadframe 10 can be tilted by either bending the leadframe 10 at a location on the leadframe 10 that is within the molded encapsulation 40, or by shaping the molded encapsulation 40 such that when the end face 2d of the optical fiber 2 is attached to the alignment portion 50b, the optical axis 31 of the light source 30 is at the angle $\theta$ relative to the optical axis 101 of the optical fiber 2. The latter approach is described below in more detail with reference to FIGS. 4 and 5.

Figure 3:
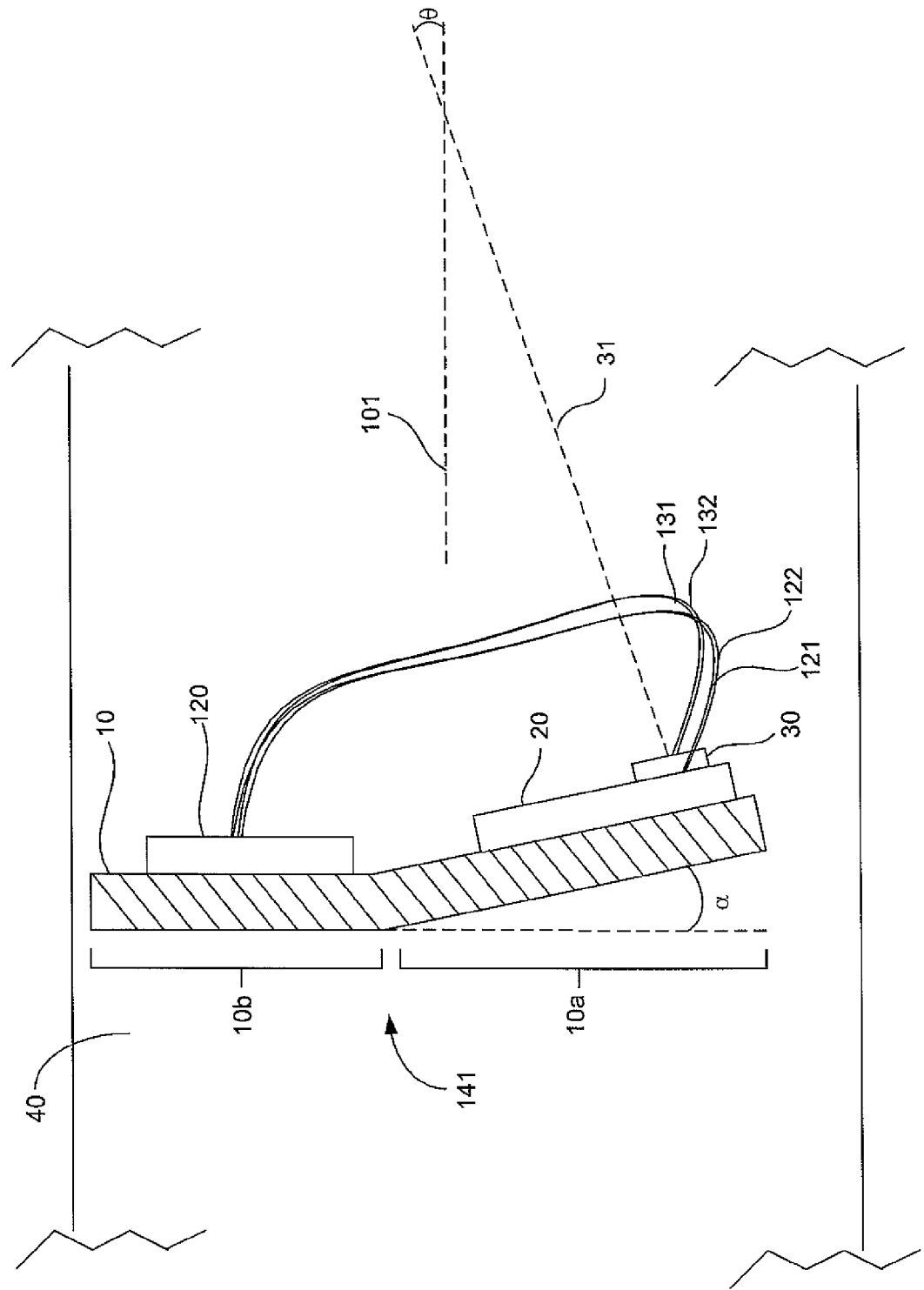
FIG. 3 illustrates a side plan view of a portion of the half-duplex, S-F optical transceiver module shown in FIG. 1 in which the leadframe is bent at a location within the molded encapsulation to tilt the portion of the leadframe on which the photodiode is mounted relative to the optical axis of the optical fiber.

FIG. 3 illustrates a side plan view of a portion of the half-duplex, S-F optical transceiver module 1 shown in FIG. 1 in which the leadframe 10 is bent at a location 141 within the molded encapsulation 40 to tilt the portion of the leadframe 10 on which the photodiode 20 is mounted relative to the optical axis 101 of the optical fiber (not shown). In addition to the photodiode 20, the leadframe 10 also has a transceiver IC 120 mounted on its upper surface, which is electrically connected by bond wires 121 and 122 to the photodiode 20 and by bond wires 131, and 132 to the light source 30. As in FIGS. 1 and 2, the light source 30 is mounted on an edge of the photodiode 20 so that it consumes only a very small amount of the light-receiving area of the photodiode 20. In accordance with this illustrative embodiment, the portion 10a of the leadframe 10 on which the photodiode 20/light source 30 are mounted has been bent relative to the portion 10b of the leadframe 10 on which the transceiver IC 120 is mounted so that the portions 10a and 10b are no longer coplanar. The portion 10a of the leadframe 10 is at a bend angle, $\alpha$, relative to the portion 10b of the leadframe 10. The bend angle $\alpha$ is generally equal to the tilt angle $\theta$.

In accordance with the embodiment of FIG. 3, the S-F optical transceiver module 1 is manufactured as follows. A die attach process is used to attach the photodiode 20 and the transceiver IC 120 to the upper surface of the leadframe 10. After the die attach process has been performed, the light source 30 is attached to the upper surface of the photodiode 20 in an edge region of the photodiode 20. A wire bonding process is then performed. During the wire bonding process, bond wires 121, 122, 131, and 132 are connected on first ends to respective electrical contact pads of the transceiver IC 120 and on second ends to either the cathodes or the anodes of the photodiode 20 and the light source 30. Specifically, the second ends of bond wires 121 and 122 are connected to the cathode and anode, respectively, of the photodiode 20 and the second ends of the bond wires 131 and 132 are connected to the cathode and anode, respectively, of the light source 30. After the wire bonding process has been performed, the leadframe 10 is bent at location 141 by a pre-selected angular amount $\alpha$, which may be, for example, 5°. The bond wires 121, 122, 131, and 132 are slightly longer than would normally be necessary in order to accommodate the bend and to prevent the bond wires 121, 122, 131, and 132 from potentially breaking or becoming disconnected.

The process of bending the leadframe 10 will typically be performed in the mold tool (not shown) that is used to mold the transparent molded encapsulation 40. A stamp (not shown) having a complimentary structure to that of the bent leadframe 10 may be employed in the mold tool to form the bend at location 141. After the leadframe 10 has been bent at location 141, a liquid plastic material that will be used to form the transparent molded encapsulation 40 is poured into the mold of the mold tool. Hardening of the plastic material forms the transparent molded encapsulation 40 having the optical coupling system 50 integrally formed therein. It should be noted that the leadframe 10 could instead be bent prior to the die attachment and wire bonding processes being performed. However, bending the leadframe 10 after the die attachment and wire bonding processes have been performed allows these processes to be performed while the leadframe 10 is in a generally flat, or planar, state. This means that no changes need to be made to the die attachment and wire bonding processes and that no additional complexity is added to these processes. The only change that is made to the manufacturing process is the step of stamping the leadframe 10 in the mold tool just prior to, or during, the performance of the molding process.

Figure 4:
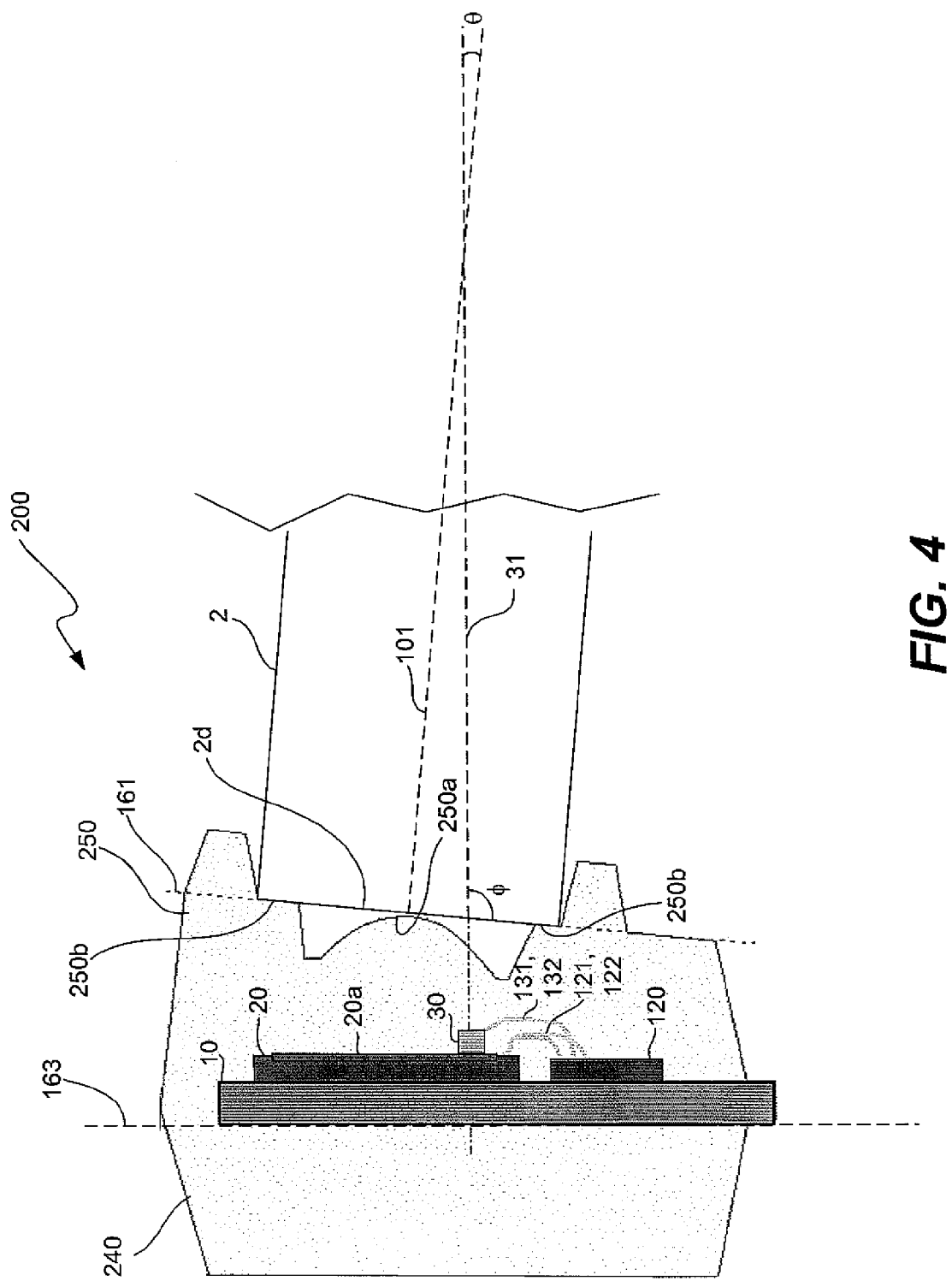
FIG. 4 illustrates a side plan view of the half-duplex, S-F optical transceiver module in accordance with another illustrative embodiment in which the portion of the leadframe that is within the transparent molded encapsulation is left unbent, and the molded encapsulation is configured to attach to the end face of the fiber at an angle to the optical axis of the leadframe.

FIG. 4 illustrates a side plan view of the half-duplex, S-F optical transceiver module 200 in accordance with another illustrative embodiment in which the portion of the leadframe 10 that is within the transparent molded encapsulation 240 is left unbent, and the molded encapsulation 240 is configured to attach to the end face 2d of the fiber 2 at an angle with the optical axis of the leadframe 10. The S-F optical transceiver module 200 shown in FIG. 4 is identical to the S-F optical transceiver module 1 shown in FIG. 1, except that, unlike the S-F optical transceiver module 1 shown in FIG. 1, the transparent molded encapsulation 240 of the S-F optical transceiver module 200 shown in FIG. 4 is tilted with respect to the optical axes of the photodiode 20 and the light source 30. Therefore, like numerals in FIGS. 1 and 4 represent like elements or components of the modules 1 and 200.

It can be seen from a comparison of FIGS. 1 and 4 that the transparent molded encapsulations 40 and 240, respectively, are slightly different. The transparent molded encapsulation 240 of the module 200 is configured such that the surfaces of the alignment portions 250b that abut with the end face 2d of the fiber 2 are at an angle, ϕ, to the optical axis 31 of the light source 30, where ϕ is related to θ by the equation: ϕ=θ+90°. The surfaces of the alignment portions 250b that abut with the end face 2d of the fiber 2 are generally co-planar and reside on a plane that is represented by the dashed line labeled with reference numeral 161. The end face 2d of the fiber 2 attaches to the optical coupling device 250 with the end face 2d abutting the surfaces of the alignment devices 250b such that the optical axis 101 of the fiber 2 is generally orthogonal to the plane 161 on which the surfaces of the alignment devices 250b reside. Thus, the degree to which the plane 161 is titled with reference to the optical axis 31 of the light source 30 dictates the degree with which the optical axis 101 of the optical fiber 2 is tilted with respect to the optical axis 31 of the light source 30. The leadframe 10, however, is unbent, and is generally planar. The plane in which the leadframe 10 lies is represented by the dashed line labeled with reference numeral 163, which is generally orthogonal to the optical axis 31 of the light source 30.

As with the arrangement described above with reference to FIG. 2, the tilt of the optical axis 31 of the light source 30 with respect to the optical axis 101 of the optical fiber 2 increases the amount of light emitted by the light source 30 that is coupled into the core of the optical fiber 2. This, in turn, increases the optical coupling efficiency of the transmitted light, i.e., of the light emitted by the light source 30 without reducing the optical coupling efficiency of the received light, i.e., the light received by the light-receiving surface of the photodiode 20. In addition, because the light source 30 is located on an edge region of the photodiode 20, the light source 30 blocks very little of the light passing out of the end face 2d of the optical fiber 2, and so does not appreciably reduce the optical coupling efficiency of the received light. Furthermore, these advantages are realized using a relatively simple optical coupling system 250 that is integrally formed in the transparent molded encapsulation 240 when the above-described molding process is performed. In accordance with the illustrative embodiment of FIG. 4, a single lens element 250a of the optical coupling system 250 is used to couple the transmitted light and the received light between the end face 2d of the optical fiber 2 and the light source 30 and photodiode 20, respectively. This type of arrangement is easier to manufacture and implement than the more complex optical coupling systems of known S-F transceiver modules, which may include, for example, optical beam splitters and other more complicated optical configurations.

Figure 5:
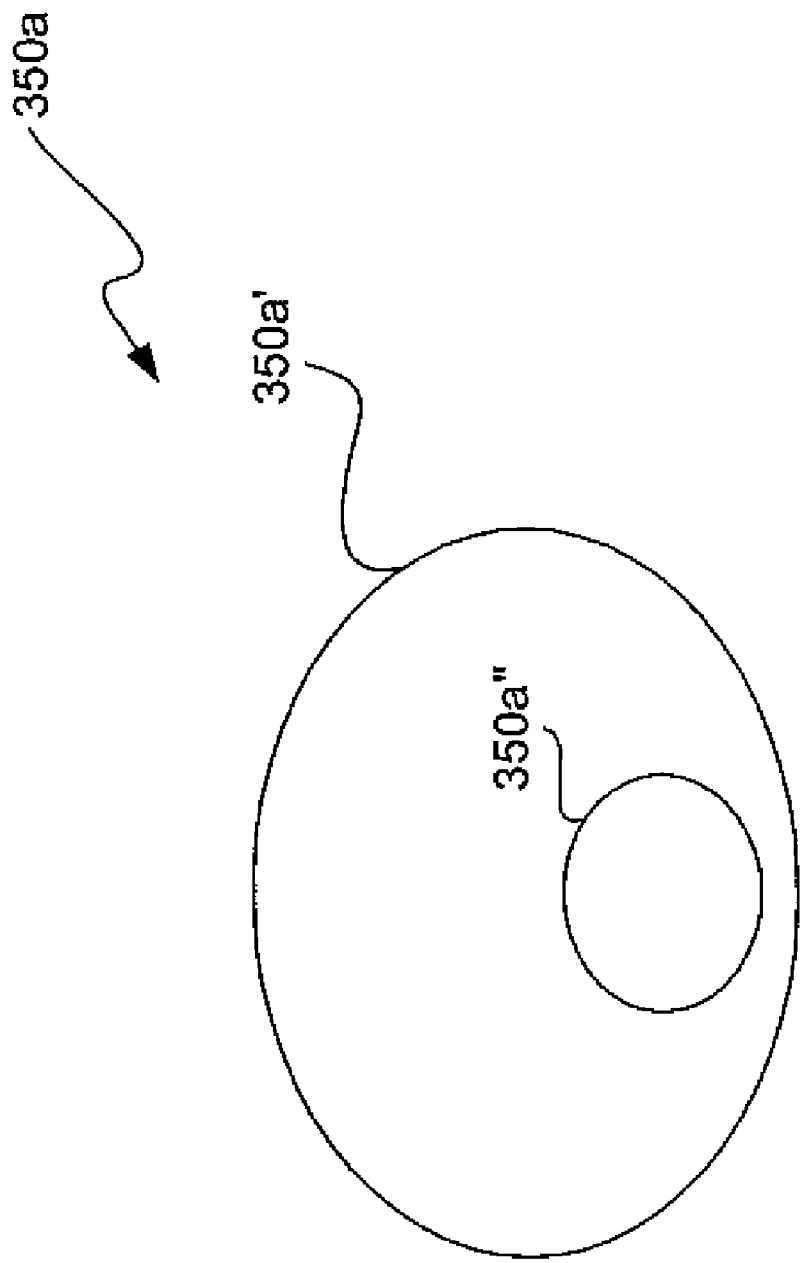
FIG. 5 illustrates a lens element of an optical coupling system in accordance with an illustrative embodiment, which may be substituted for the optical coupling systems shown in FIGS. 1, 2 and 4.

FIG. 5 illustrates a lens element 350a of an optical coupling system in accordance with an illustrative embodiment. The optical coupling system having the lens element 350a may be identical to the optical coupling systems 50 or 250 of FIG. 2 or 4, respectively, except for differences between the lens element 350a and the lens elements 50a and 250a. The optical coupling system having the lens element 350a may be substituted for either of the optical coupling systems 50 and 250 shown in FIGS. 1, 2 and 4. For illustrative purposes, it will be assumed that the optical coupling system having the lens element 350a is substituted for the optical coupling system 50 shown in FIGS. 1 and 2. In contrast to the lens elements 50a and 250a of the optical coupling systems 50 and 250 shown in FIGS. 1, 2 and 4, the lens element 350a shown in FIG. 5 includes an Rx lens portion 350a' having a first focal length selected to focus the received light passing out of the end face 2d of the optical fiber 2 onto the light-receiving area 20a of the photodiode 20, and a Tx lens portion 350a" having a second focal length selected to focus light emitted by the light-emitting area 30a of the light source 30 onto the end face 2d of the optical fiber 2. The optical coupling system 350 is still relatively simple to design and implement compared to the aforementioned known optical coupling systems used with known S-F transceivers, and can be created during the aforementioned molding process as an integral part of the transparent molded encapsulation 40. Using an optical coupling system having the lens element 350a may obviate any need to tilt the optical axes of the optical fiber and of the light source relative to each other in the manner depicted in FIGS. 2 and 4 in order to increase the optical coupling efficiency of the transmitted light. On the other hand, use of an optical coupling system having lens element 350s will typically provide even better optical coupling efficiency for the transmitted light, as well as even better optical coupling efficiency for the received light.

Figure 6:
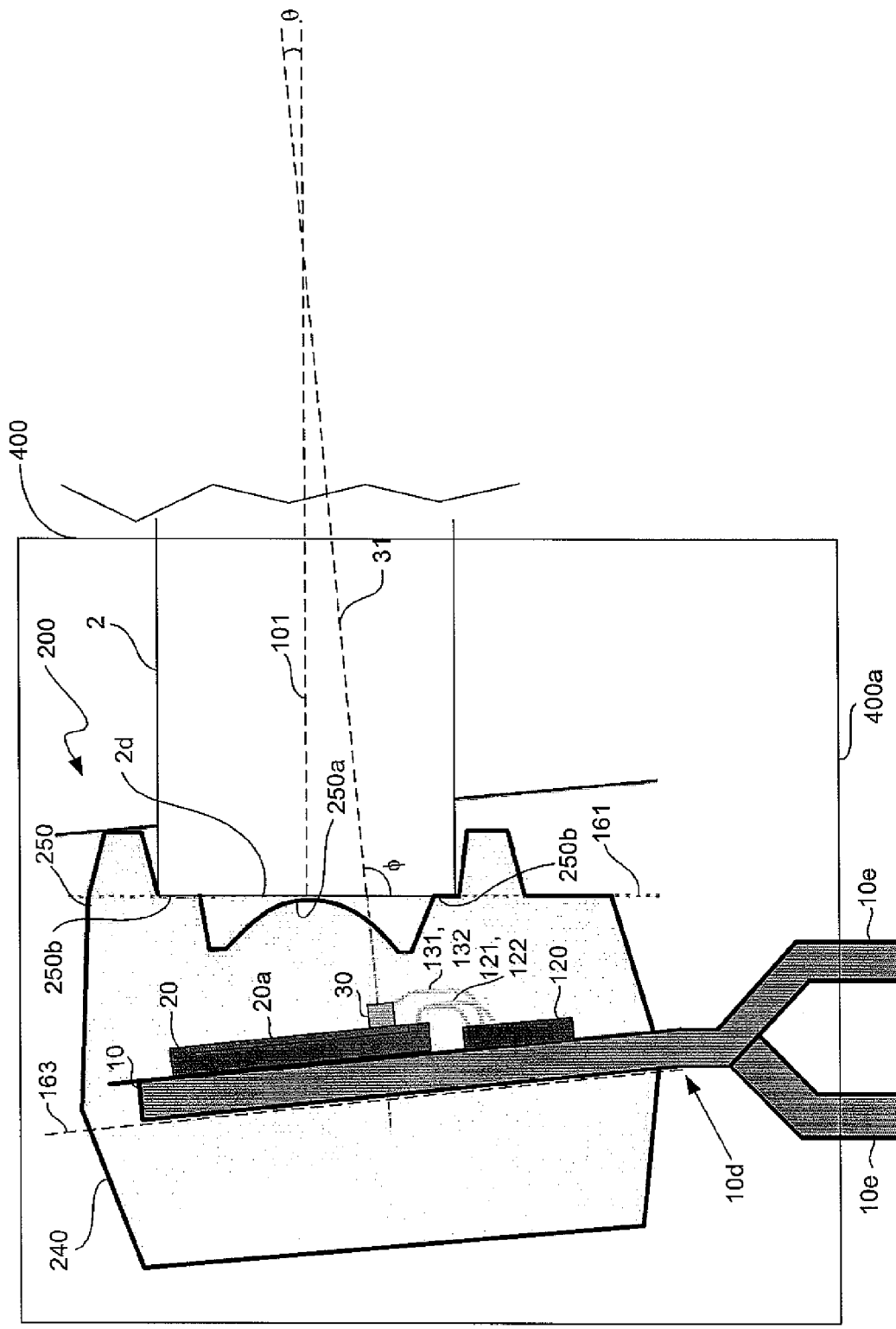
FIG. 6 illustrates a side plan view of the S-F optical transceiver module shown in FIG. 4, which shows the leadframe bent at a location on the leadframe 10 that is outside of the transparent molded encapsulation.

FIG. 6 illustrates a side plan view of the S-F optical transceiver module 200 shown in FIG. 4, which shows the leadframe 10 bent at a location 10d on the leadframe 10 that is outside of the transparent molded encapsulation 240. In FIG. 6, the S-F optical transceiver module 200 is shown assembled in a transceiver module header 400, which encapsulates the S-F optical transceiver module 200. Because the leadframe 10 is left unbent inside of the encapsulation 240 and because the encapsulation 240 is configured such that the optical axis 31 of the light source 30 is at the angle θ relative to the optical axis 101 of the fiber 2, it is preferable to bend the leadframe 10 at location 10d on the leadframe 10 just above the leads 10e of the leadframe 10 so that the leads 10e extend from the header 400 in a direction that is generally perpendicular to the side edge 400a of the header 400. Bending the leadframe 10 at location 10d allows the S-F optical transceiver module 200 to be tilted with respect to the fiber end face 2d to provide better transmitter optical coupling efficiency, while also allowing the leads 10e to extend perpendicularly from the side edge 400a of the header 400 so that the leads 10e can easily connect to electrical contacts (not shown) on a circuit board (not shown) using standard connections and processes. In addition, because the leadframe 10 is left unbent within the transparent molded encapsulation 240, the die attachment, wire bonding, and molding processes can be performed in the typical manner using typically die, wire bonding and molding processes. Thus, no changes to these processes need to be made, other than providing the mold tool (not shown) with the proper molds needed for achieving the desired shape of the transparent molded encapsulation 240 and the optical coupling system 250 formed therein.

It should be noted that in each of the embodiments described above with reference to FIGS. 1, 2, 4, and 6, the light source 30 may be either a laser diode or an LED. In most of the aforementioned known S-F optical transceiver modules, it is necessary to use a laser diode as opposed to an LED as the light source in order to achieve a smaller far field than that which is achieved using an LED. As stated above, the smaller far field achieved by a laser diode is often needed to reduce optical crosstalk between the light sources of the optical transceivers connected on opposite ends of an optical link. In accordance with embodiments of the invention, an LED can be used despite the larger far field because mounting the light source in an edge region of the light-receiving surface of the photodiode and using a relatively simple optical coupling system to cause the emitted light to be launched into a particular region of the fiber core reduces or eliminates the potential for optical crosstalk between the light sources located at opposite ends of the fiber link. In other words, the above-described SDM configuration of the invention reduces or eliminates the potential for optical crosstalk between the light sources located at opposite ends of the fiber link even in cases where an LED is used rather than a laser diode.

It should be noted that the invention has been described with reference to a few illustrative embodiments for the purpose of demonstrating the principles and concepts of the invention. The invention is not limited to the embodiments described herein, as will be understood by those of ordinary skill in the art in view of the description provided herein. For example, although FIGS. 1-3 and 6 illustrate particular configurations for the optical coupling systems of the S-F optical transceiver modules, the invention is not limited to these particular configurations, as will be understood by persons of ordinary skill in the art in view of the description being provided herein. Many modifications may be made to the embodiments described herein without deviating from the goals or objectives of the invention, and all such modifications are within the scope of the invention.

What is claimed is:

1. A half-duplex, single-fiber (S-F) optical transceiver module for communication over an optical link, the S-F optical transceiver module comprising:
   a leadframe having at least a first leadframe portion, a second leadframe portion, and a plurality of electrically conductive leads, the first leadframe portion having an upper surface and a lower surface, the second leadframe portion having an upper surface and a lower surface;
   a photodiode having a cathode, an anode, an upper light-receiving surface, and a lower mounting surface, the photodiode being disposed on the upper surface of the first leadframe portion such that the lower mounting surface of the photodiode is adjacent the upper surface of the first leadframe portion;
   a light source having a cathode, an anode, an upper light-emitting surface, and a lower mounting surface, the light source being disposed on an edge region of the upper light-receiving surface of the photodiode such that the lower mounting surface of the light source is adjacent the upper light-receiving surface of the photodiode in the edge region of the upper light-receiving surface;
   a transparent molded encapsulation that encapsulates the photodiode, the light source, and a portion of the leadframe that includes at least the first and second leadframe portions; and
   an optical coupling system integrally formed in the transparent molded encapsulation, the optical coupling system including at least a lens portion and an alignment portion, the alignment portion being configured to provide at least one surface that abuts a first end face of an optical fiber when the first end face of the optical fiber is attached to the optical coupling system, and wherein the lens portion is configured to optically couple light passing out of the first end face of the optical fiber onto the upper light-receiving surface of the photodiode and to optically couple light emitted from the upper light-emitting surface of the light source onto the end face of the optical fiber and into a core of the optical fiber, and wherein the mounting of the light source on the edge region of the upper light-receiving surface of the photodiode ensures that the light source prevents only a very small portion of the light passing out of the first end face from being optically coupled by the lens portion onto the upper light-receiving surface of the photodiode, and wherein the first leadframe portion is tilted with respect to the second leadframe portion such that an optical axis of the light source is tilted at a non-zero tilt angle with respect to an optical axis of the optical fiber, the non-zero tilt angle being greater than 0 degrees and less than 90 degrees, and wherein the tilt of the optical axis of the light source with respect to the optical axis of the optical fiber ensures that light emitted from the light source is optically coupled efficiently into the core of the optical fiber.

2. The half-duplex, S-P optical transceiver module of claim 1, wherein the light source is a light-emitting diode (LED).

3. The half-duplex, S-P optical transceiver module of claim 1, wherein the light source is a vertical cavity surface emitting laser diode (VCSEL).

4. The half-duplex, S-F optical transceiver module of claim 1, wherein the non-zero tilt angle is selected from a range of angles ranging between about 5 degrees and about 20 degrees.

5. The half-duplex, S-F optical transceiver module of claim 1, further comprising:
   a transceiver integrated circuit (IC) mounted on the upper surface of the second portion of the leadframe; and
   electrically conductive bond wires having first ends connected to electrical contact pads of the transceiver IC and second ends connected to either the cathodes or anodes of the photodiode and the light source.

6. A method for optically coupling optical signals between a half-duplex, single-fiber (S-F) optical transceiver module and a first end face of a single optical fiber attached to the S-F optical transceiver module, the method comprising:
   providing an S-F optical transceiver module having a leadframe, a photodiode, a light source, and a transparent molded encapsulation having an optical coupling system integrally formed therein, the leadframe having at least a first leadframe portion, a second leadframe portion, and a plurality of electrically conductive leads, the first and second leadframe portions each having an upper surface and a lower surface, the photodiode having a cathode, an anode, an upper light-receiving surface, and a lower mounting surface, the photodiode being disposed on the upper surface of the first leadframe portion such that the lower mounting surface of the photodiode is adjacent the upper surface of the first leadframe portion, the light source having a cathode, an anode, an upper light-emitting surface, and a lower mounting surface, the light source being disposed on an edge region of the upper light-receiving surface of the photodiode such that the lower mounting surface of the light source is adjacent the upper light-receiving surface of the photodiode in the edge region of the upper light-receiving surface, the transparent molded encapsulation encapsulating the photodiode, the light source, and a portion of the leadframe that includes at least the first and second leadframe portions, and wherein the first leadframe portion is tilted with respect to the second leadframe portion such that an optical axis of the light source is tilted at a non-zero tilt angle with respect to an optical axis of the optical fiber, the non-zero tilt angle being greater than 0 degrees and less than 90 degrees;

with a lens portion of the optical coupling system, optically coupling light passing out of the first end face of the optical fiber onto the upper light-receiving surface of the photodiode and optically coupling light emitted by the upper light-emitting surface of the light source onto the first end face of the optical fiber, and wherein the mounting of the light source on the edge region of the upper light-receiving surface of the photodiode ensures that the light source prevents only a very small portion of the light passing out of the first end face from being optically coupled by the lens portion onto the upper light-receiving surface of the photodiode, and wherein the tilt of the optical axis of the light source with respect to the optical axis of the optical fiber ensures that light emitted from the light source is optically coupled efficiently into the core of the optical fiber.

7. The method of claim 6, wherein the light source is a light-emitting diode (LED).

8. The method of claim 6, wherein the light source is a vertical cavity surface emitting laser diode (VCSEL).

9. The method of claim 6, wherein the tilt angle is selected from a range of angles ranging between about 5 degrees and about 20 degrees.

10. The method of claim 6, wherein the leadframe has a transceiver integrated circuit (IC) mounted on the upper surface of the second portion of the leadframe, and wherein electrically conductive bond wires are connected on first ends of the bond wires to electrical contact pads of the transceiver IC and on second ends of the bond wires to either the cathodes or anodes of the photodiode and the light source.

11. A half-duplex, single-fiber (S-F) optical transceiver module for communication over an optical link, the S-F optical transceiver module comprising:
   a leadframe having at least a first leadframe portion, a second leadframe portion, a third leadframe portion, the third leadframe portion comprising a plurality of electrically conductive leads, the first leadframe portion having an upper surface and a lower surface, the second leadframe portion having an upper surface and a lower surface that are generally parallel to and coplanar with an upper surface and a lower surface, respectively, of the first leadframe portion;
   a photodiode having a cathode, an anode, an upper light-receiving surface, and a lower mounting surface, the photodiode being disposed on the upper surface of the first leadframe portion such that the lower mounting surface of the photodiode is adjacent the upper surface of the first leadframe portion;
   a light source having a cathode, an anode, an upper light-emitting surface, and a lower mounting surface, the light source being disposed on an edge region of the upper light-receiving surface of the photodiode such that the lower mounting surface of the light source is adjacent the upper light-receiving surface of the photodiode in the edge region of the upper light-receiving surface;
   a transparent molded encapsulation that encapsulates the photodiode, the light source, and a portion of the leadframe that includes at least the first and second leadframe portions; and
   an optical coupling system integrally formed in the transparent molded encapsulation, the optical coupling system including at least a lens portion and an alignment portion, the alignment portion being configured to provide at least one surface that abuts a first end face of an optical fiber when the first end face of the optical fiber is attached to the optical coupling system, and wherein the lens portion is configured to optically couple light passing out of the first end face of the optical fiber onto the upper light-receiving surface of the photodiode and to optically couple light emitted from the upper light-emitting surface of the light source onto the end face of the optical fiber and into a core of the optical fiber, and wherein a third portion of the leadframe comprising the electrically conductive leads is not encapsulated in the transparent molded encapsulation, and wherein the encapsulated portion of the leadframe is tilted within the transparent molded encapsulation such that if an end face of an optical fiber is attached to the optical coupling system, an optical axis of the light source is at a non-zero tilt angle with respect to an optical axis of the optical fiber, the non-zero tilt angle being greater than 0 degrees and less than 90 degrees, and wherein the non-zero tilt angle of the optical axis of the light source with respect to the optical axis of the optical fiber ensures that light emitted from the light source is optically coupled efficiently into the core of the optical fiber.

12. The half-duplex, S-F optical transceiver module of claim 11, wherein the non-zero tilt angle is selected from a range of angles ranging between about 5 degrees and about 20 degrees.

13. The half-duplex, S-F optical transceiver module of claim 12, wherein the third portion of the leadframe comprising the electrically conductive leads is bent at a location on the leadframe between the encapsulated portion of the leadframe and the leads such that each of the leads is at a non-zero angle with respect to the plane in which the leadframe lies.

14. The half-duplex, S-F optical transceiver module of claim 13, further comprising:
   a header, the header encapsulating all of the S-F optical transceiver module except for respective ends of the respective electrically conductive leads, and wherein the respective ends of the respective electrically conductive leads extend through a first side edge of the header in a direction that is generally perpendicular to the first side edge of the header.

15. A method for optically coupling optical signals between a half-duplex, single-fiber (S-F) optical transceiver module and a first end face of a single optical fiber attached to the S-F optical transceiver module, the method comprising:
   providing an S-F optical transceiver module having a leadframe, a photodiode, a light source, and a transparent molded encapsulation having an optical coupling system integrally formed therein, the leadframe having at least a first leadframe portion, a second leadframe portion, and a third leadframe portion, the first and second leadframe portions each having an upper surface and a lower surface, the third leadframe portion comprising a plurality of electrically conductive leads, the photodiode having a cathode, an anode, an upper light-receiving surface, and a lower mounting surface, the photodiode being disposed on the upper surface of the first leadframe portion such that the lower mounting surface of the photodiode is adjacent the upper surface of the first leadframe portion, the light source having a cathode, an anode, an upper light-emitting surface, and a lower mounting surface, the light source being disposed on an edge region of the upper light-receiving surface of the photodiode such that the lower mounting surface of the light source is adjacent the upper light-receiving surface of the photodiode in the edge region of the upper light-receiving surface, the transparent molded encapsulation encapsulating the photodiode, the light source, and a portion of the leadframe that includes at least the first and second leadframe portions, and wherein the encapsulated portion of the leadframe is tilted within the transparent molded encapsulation such that an optical axis of the light source is at a non-zero tilt angle with respect to an optical axis of an optical fiber that is attached on an end face of the optical fiber to the optical coupling system, the non-zero tilt angle being greater than 0 degrees and less than 90 degrees; and with a lens portion of the optical coupling system, optically coupling light passing out of the first end face of the optical fiber onto the upper light-receiving surface of the photodiode and optically coupling light emitted by the upper light-emitting surface of the light source onto the first end face of the optical fiber, and wherein the non-zero tilt angle of the optical axis of the light source with respect to the optical axis of the optical fiber ensures that light emitted from the light source is optically coupled efficiently into the core of the optical fiber.

16. The method of claim 15, wherein the non-zero tilt angle is selected from a range of angles ranging between about 5 degrees and about 20 degrees.

17. The method of claim 1, wherein the third portion of the leadframe comprising the electrically conductive leads is bent at a location on the leadframe between the encapsulated portion of the leadframe and the leads such that each of the leads is at a non-zero angle with respect to the plane in which the leadframe lies.

18. The method of claim 17, further comprising:

providing a header that encapsulates all of the S-F optical transceiver module except for respective ends of the respective electrically conductive leads, and wherein the respective ends of the respective electrically conductive leads extend through a first side edge of the header in a direction that is generally perpendicular to the first side edge of the header.

* * * * *